United States Patent [19]

Liron

[11] Patent Number: 5,331,206
[45] Date of Patent: Jul. 19, 1994

[54] CIRCUIT FOR DRIVING A TRANSMISSION LINE

[75] Inventor: John E. Liron, Grass Valley, Calif.

[73] Assignee: The Grass Valley Group, Inc., Nevada City, Calif.

[21] Appl. No.: 877,000

[22] Filed: May 1, 1992

[51] Int. Cl.$^5$ .................. H03K 3/01; H03K 17/56; H03K 17/60

[52] U.S. Cl. .................. 307/270; 307/241; 307/254

[58] Field of Search ............ 307/270, 244, 473, 241, 307/242, 253, 254

[56] References Cited

U.S. PATENT DOCUMENTS

| | | | |
|---|---|---|---|
| 4,748,346 | 5/1988 | Emori | 307/270 |
| 4,870,301 | 9/1989 | Petty | 307/473 |
| 5,087,833 | 2/1992 | Sugai | 307/242 |
| 5,134,313 | 7/1992 | Umeyama et al. | 307/353 |

Primary Examiner—Curtis Kuntz
Assistant Examiner—Sinh Tran
Attorney, Agent, or Firm—Francis I. Gray; John Smith-Hill

[57] ABSTRACT

A circuit for driving a transmission line composed of first and second conductors, comprises input transistors for providing a differential signal, and first and second output transistors having their bases connected to receive the differential signal, their collectors connected to a first reference potential level, and their emitters connected to the first and second conductors respectively. An output enable circuit selectively places the output transistors either in a conductive condition, in which they apply the differential signal to the transmission line, or in a non-conductive condition, in which the isolate the transmission line from the input transistors.

10 Claims, 2 Drawing Sheets

CIRCUIT FOR DRIVING A TRANSMISSION LINE

BACKGROUND OF THE INVENTION

This invention relates to a circuit for driving a transmission line.

A large switcher may have several hundred inputs and only one output. The purpose of the switcher is to allow a single input to be selected and connected to the output, while all the other inputs are isolated from the output.

It is conventional to implement a large switcher having n*k inputs and only one output by using k crosspoint modules each having n inputs and one output. Each of these modules can be viewed conceptually as an array of n parallel input lines, a single output line extending perpendicular to the input lines, and n crosspoint elements connected between the output line and the input lines respectively. The crosspoint elements are switches, each of which is able to connect a single input line of the crosspoint module to the output line thereof. A configuration controller is used to select any one of the crosspoint elements, and the selected crosspoint element is rendered conductive while the other crosspoint elements remain non-conductive. The input line associated with the selected crosspoint element is thereby connected to the output bus and provides the switcher output. It will be appreciated that the input and output lines of the switcher might each be a single conductor for carrying single-ended signals, or two conductors for carrying differential signals.

The output lines of the crosspoint modules may be connected through an output bus to an output module that provides a switcher output and buffers the output bus.

In order to apply this output bus architecture to a switcher used for switching high speed digital signals, e.g. data signals at 300 Mb/s or higher, the bus must be treated as a transmission line, i.e. a conduction path that has a uniform characteristic impedance along its length. If an unterminated stub projects from the conduction path, this may result in the path not having a uniform characteristic impedance. The allowable length of a stub that can project from the conduction path without causing an unacceptable variation in characteristic impedance decreases as the signal frequency increases. For a digital data signal at 300 Mb/s, the maximum acceptable length of an unterminated stub is about 1–2 cm. Restrictions inherent in the construction of a large switcher generally necessitate that the crosspoint modules be at a distance of 10 cm or more from the output bus, and the conductors extending from the crosspoint modules to the bus constitute unterminated stubs. These unterminated stubs preclude use of the output bus architecture with high speed digital signals, and therefore switchers designed for use with high speed digital signals generally use multiplexers to select the crosspoint module that is to provide the switcher's output.

The output lines of the crosspoint modules are connected to their respective multiplexers through output drivers. The output drivers are normally driven continuously even though only one multiplexer at a time provides the switcher's output signal. The total power consumed by the k output drivers is then approximately k times the power needed to provide the output signal of the selected crosspoint module.

SUMMARY OF THE INVENTION

In accordance with a first aspect of the present invention there is provided a circuit for driving a transmission line composed of first and second conductors, the circuit comprising input means for providing a differential signal, first and second output transistors each having a base, a collector and an emitter, the bases of the output transistors being connected to receive the differential signal, the collectors being connected to a first reference potential level, and the emitters being connected to the first and second conductors respectively, and output enable means for selectively placing the output transistors either in a conductive condition, in which they apply the differential signal to the transmission line, or in a non-conductive condition, in which they isolate the transmission line from the input means.

According to a second aspect of the present invention there is provided a switcher composed of at least first and second crosspoint modules each having a plurality of inputs and one output, a differential transmission line having first and second conductors, and at least first and second bus drivers having inputs connected to the outputs of the crosspoint modules respectively and having differential outputs connected to the differential transmission line, and wherein each bus driver comprises input means for receiving a signal applied to the input of the bus driver and providing a differential signal, first and second output transistors each having a base, a collector and an emitter, the bases of the output transistors being connected to receive the differential signal, the collectors being connected to a first reference potential level and the emitters being connected to the first and second conductors respectively, and output enable means for selectively placing the output transistors either in a conductive condition, in which they apply the differential signal to the transmission line, or in a non-conductive condition, in which they isolate the transmission line from the input means.

According to a third aspect of the present invention there is provided a switcher composed of at least first and second crosspoint modules each having a plurality of inputs and one output, a first differential transmission line having first and second conductors, and at least first and second bus drivers having inputs connected to the outputs of the crosspoint modules respectively and having differential outputs connected to the first differential transmission line, and wherein each bus driver comprises input means for receiving a signal applied to the input of the bus driver and providing a differential signal, output means connected to the first differential transmission line, a second differential transmission line applying the differential signal to the output means, and output enable means for selectively placing the output means either in a conductive condition, in which they apply the differential signal to the first transmission line, or in a non-conductive condition, in which they isolate the first transmission line from the second transmission line.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
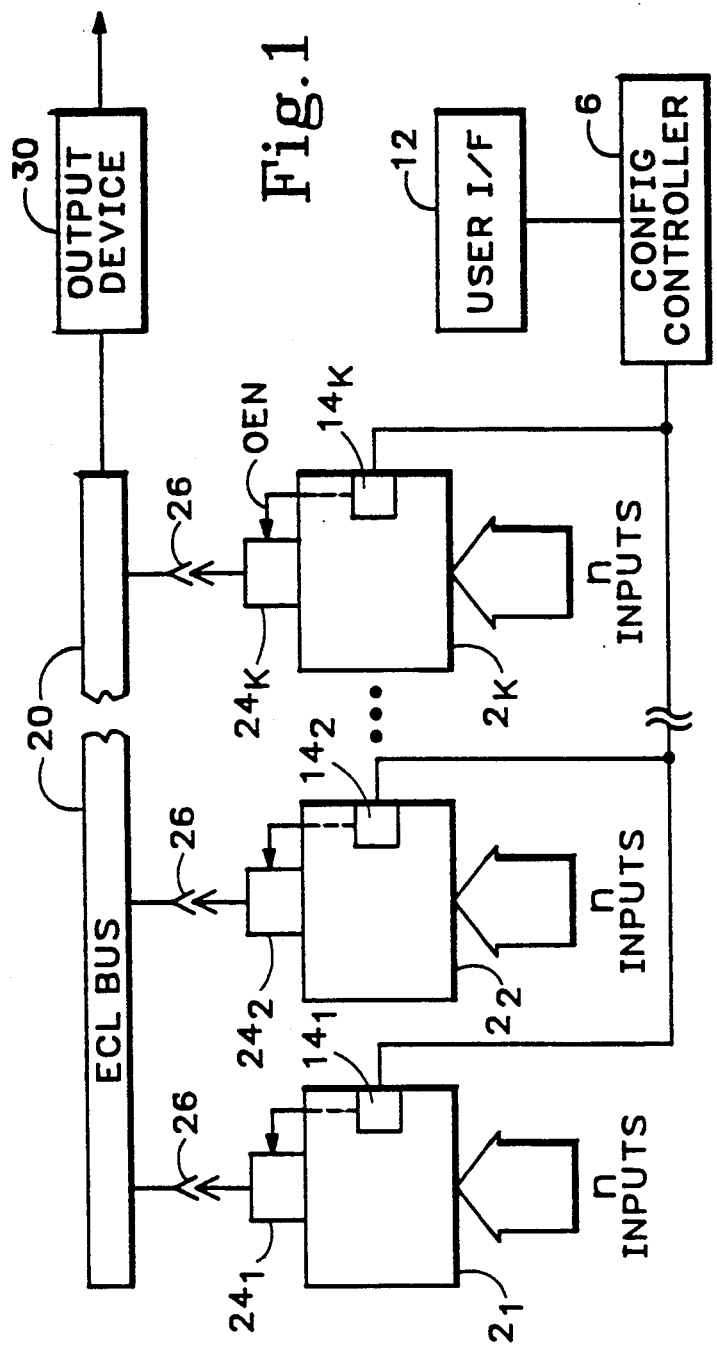
FIG. 1 is a block diagram illustrating a switcher composed of multiple crosspoint modules and an output bus.

The switcher shown in FIG. 1 comprises k crosspoint modules 2 each having n differential inputs and one differential output. The crosspoint modules 2 each include n crosspoint elements effective between respective input lines and an output line and selectively operable to connect a single input line to the output line. The switcher also comprises a configuration controller 6 that receives a configuration command, for example from a user interface 12, and responds by issuing a configuration control signal to each of the crosspoint modules. The configuration control signal is a digital word that identifies a single crosspoint element. Each crosspoint module includes a decoder 14 that receives the configuration control signal. In response to the configuration control signal, the decoder of the module that contains the selected crosspoint element issues a control signal to that crosspoint element to cause it to become conductive. In this manner, the input line associated with the selected crosspoint element is connected to the output line of the crosspoint module containing that crosspoint element.

The switcher also comprises a differential ECL bus 20 and bus drivers $24_1$-$24_k$ having their inputs connected to the outputs of the crosspoint modules $2_1$-$2_k$ respectively and having their outputs connected to the bus 20. Two of the bus drivers, designated $24_1$1 and $24_k$ respectively, are shown schematically in FIG. 2. An output buffer 30 buffers the bus 20 and provides a differential output signal.

Figure 2:
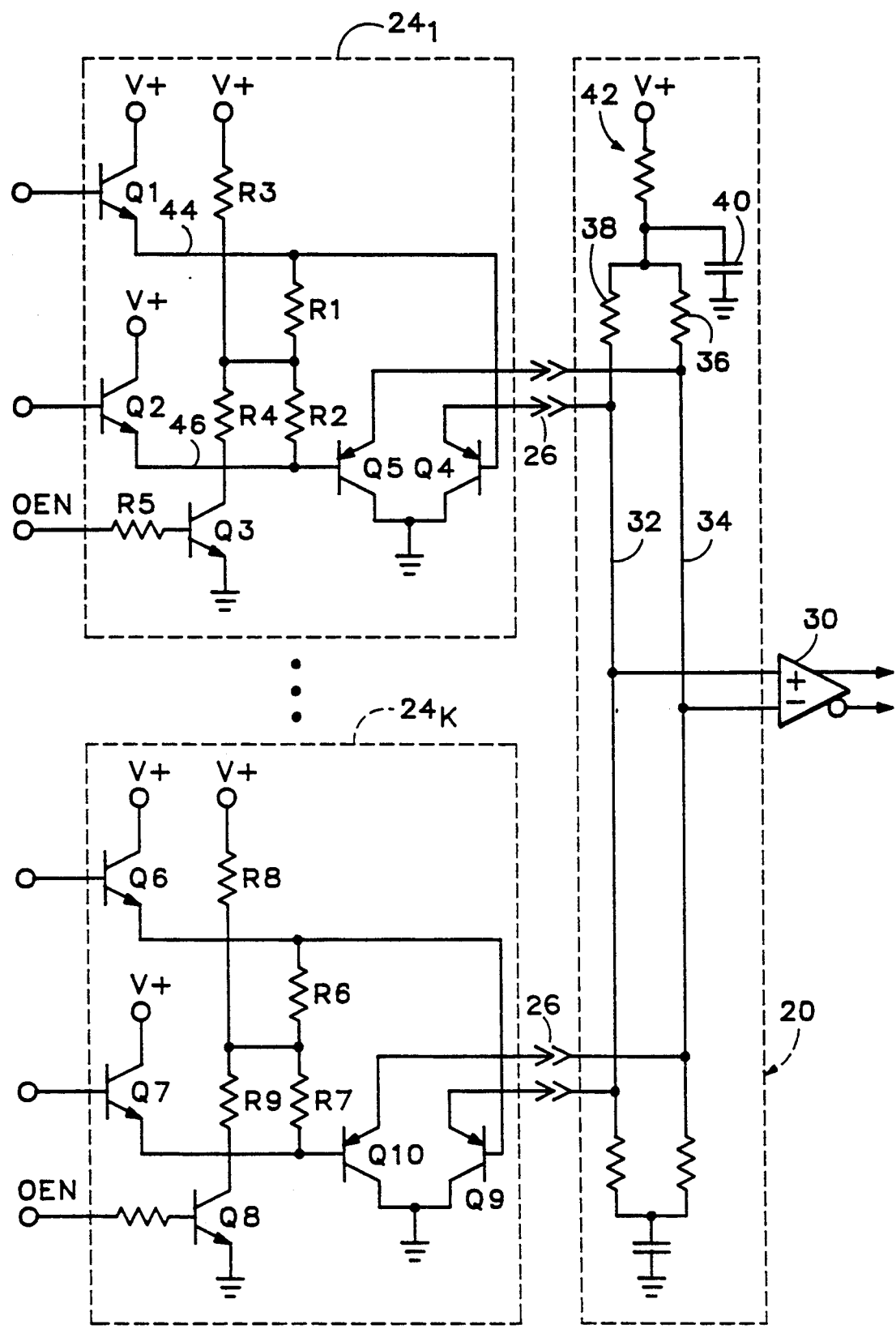
FIG. 2 is a schematic diagram of part of the switcher.

In a practical implementation of the switcher shown in FIGS. 1 and 2, the crosspoint modules and their associated bus drivers are mounted on one or more circuit boards and the outputs of the bus drivers are connected to the ECL bus 20 through an edge connector 26. Spatial constraints necessitate that the crosspoint modules be spaced from the edge connector 26 by a distance that is substantially greater than the maximum tolerable stub length.

The ECL bus 20 comprises two conductors 32, 34 forming a differential transmission line having a characteristic impedance $Z_0$ and terminated at one end with a split termination consisting of resistors 36, 38 each of resistance $Z_0/2$ and a capacitor 40 connected between the junction of the resistors 36 and 38 and ground. The transmission line is similarly terminated at its opposite end. The bus is powered by a pull-up resistor 42 connected between the positive supply V+ (plus 5 volts) and the junction of the resistors 36 and 38.

The bus driver $24_1$ comprises two NPN transistors Q1 and Q2 that receive the differential output of the crosspoint module $2_1$ at their bases. The collectors of the transistors Q1 and Q2 are connected to the positive supply while their emitters are connected to the bases of PNP transistors Q4 and Q5 respectively. Two resistors R1 and R2 are connected in series between the emitters of the transistors Q1 and Q2. The bus driver also has an output enable terminal (OEN) that is connected through a resistor R5 to the base of an NPN transistor Q3, whose emitter is connected to ground and whose collector is connected through resistors R4 and R3 to the positive supply V+. The output enable terminal is connected to the decoder of the crosspoint module. The connection point of the resistors R3 and R4 is connected to the connection point of the resistors R1 and R2. The collectors of the transistors Q4 and Q5 are connected to ground and their emitters are connected to the two conductors 32 and 34 respectively.

When the configuration command specifies one of the crosspoint elements of the crosspoint module $2_1$, the decoder of that module issues a control signal that causes the selected crosspoint element to become conductive and also connects the output enable terminal of the bus driver $24_1$ to the positive supply V+.

The output line of the crosspoint module $2_1$ applies a differential signal to the bases of the transistors Q1 and Q2, and this signal appears at the emitters of these transistors. The positive voltage applied to the output enable terminal of the bus driver $24_1$ turns on the transistor Q3 through the resistor R5. The transistor Q3 then provides emitter pull-down current for the input transistors Q1 and Q2 through the resistors R1, R2 and R4. The emitters of the transistors Q1 and Q2 are now significantly lower than V+ minus one base-emitter drop and therefore transistors Q4 and Q5 conduct, their current being supplied by the pull-up resistor 42 through the termination resistors 36, 38.

When the bus driver $24_1$ is in the on state, each of the other bus drivers is held in the off state, by maintaining its output enable terminal at ground. The operation of a bus driver in the off state will be discussed with reference to the bus driver $24_k$.

When the output enable terminal of the bus driver $24_k$ is at ground, the transistor Q8 is off and consequently the resistor R9 does not supply pull-down current for the transistors Q6 and Q7 and the emitters of those transistors are pulled up to the positive supply through the resistors R6, R7 and R8. Therefore, the transistors Q6 and Q7 are turned off. Also, since the transistor Q3 is on the voltage at the base of the transistor Q4 is more negative than that at the base of the transistor Q9 and therefore the transistor Q9 is off, and similarly the voltage at the base of the transistor Q5 is more negative than that of the base of the transistor Q10 and the transistor Q10 is off. Since the transistors Q9 and Q10 are non-conducting, their emitters present a high impedance to the transmission line.

In the practical implementation of the switcher described with reference to FIGS. 1 and 2, the bus driver $24_1$, for example, is distributed between two locations. The input transistors Q1 and Q2 are implemented as part of the crosspoint module and are therefore spaced at a substantial distance from the transmission line 20, whereas the transistors Q4 and Q5 can be very close (about 2 cm) to the transmission line. Therefore, the length of the connections between the transmission line 20 and the transistors Q4 and Q5 is less than the maximum tolerable stub length. Since the connections between the transmission line and the transistors Q4 and Q5 are shorter than the maximum tolerable stub length, and the transistors Q9 and Q10 of the non-selected bus drivers present a high impedance, the uniform impedance of the bus is preserved. The conductors 44, 46 that connect the emitters of the transistors Q1 and Q2 to the bases of the transistors Q5 and Q6 form a differential transmission line that is terminated by the resistors R1 and R2 and therefore the signal provided by the transistors Q1 and Q2 is delivered to the transistors Q4 and Q5 without undue degradation.

Figure 3:
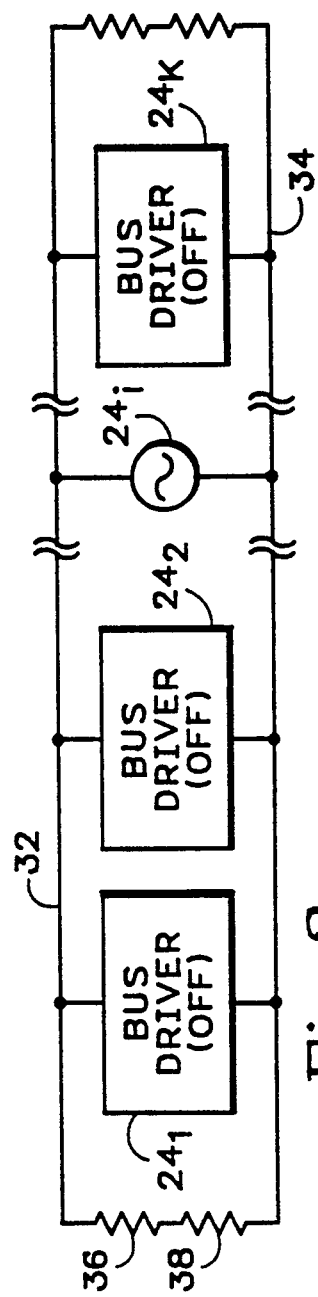
FIG. 3 illustrates the output bus when one crosspoint module is active and the other crosspoint modules are inactive.

FIG. 3 represents the bus as two stub transmission lines, each terminated in its characteristic impedance, driven at their junction by a voltage source (the selected bus driver 24j).

The power for impressing the output signal provided by the selected crosspoint module on the bus is provided to the selected bus driver through the current source resistor. Since the current source resistor 42 provides current to only one bus driver, and the dual emitter followers Q6 and Q7 of all other bus drivers are off, the non-selected bus drivers do not consume power.

It will be appreciated that the invention is not restricted to the particular embodiment that has been described, and that variations may be made therein without departing from the scope of the invention as defined in the appended claims and equivalents thereof. For example, a capacitor may be connected between the junction of the resistors R3 and R4 and ground to provide a path having low AC impedance between that node and ground and thereby force the bus to be truly differential.

I claim:

1. A circuit for driving a transmission line composed of first and second conductors, said circuit comprising:
    first and second transistors each having a base, a collector and an emitter, the bases of the first and second transistors being connected to receive an input differential signal, and the collectors being connected to a first reference potential level,
    a differential transmission line having two conductors with an input end and an output end, the emitters of the first and second transistors being connected to the input end,
    an output enable transistor having a base, a collector and an emitter, the emitter being connected to a second reference potential level and the collector being connected to the first reference potential level through a resistor, and
    first and second resistors coupled in series between the conductors at the output end of the differential transmission line, a node between the first and second resistors being coupled to the collector of the output enable transistor and to said resistor so that the output enable transistor selectively places the first and second transistors either in a conductive condition, in which they apply the input differential signal to the input end of the differential transmission line for transmission to the transmission line, or in a non-conductive condition, in which they isolate the transmission line from the input differential signal.

2. A circuit according to claim 1 wherein the output enable means further comprises means for disconnecting the differential transmission line from the first and second conductors of the transmission line when the first and second transistors are in the non-conductive condition.

3. A circuit according to claim 2 wherein the disconnecting means comprises third and fourth transistors each having a base, a collector and an emitter, the output end of the differential transmission line being coupled to the bases to receive the differential signal, the collectors being connected to the second reference potential level, and the emitters being coupled to the first and second conductors of the transmission line respectively.

4. A switcher composed of at least first and second crosspoint modules, each having a plurality of n inputs and one output, a transmission line having first and second conductors, and at least first and second bus drivers, each having a differential input connected to the output of the respective crosspoint module and having a differential output connected to the transmission line, and wherein each bus driver comprises input means for receiving a differential signal applied to the differential input of the bus driver and for providing a differential signal output, first and second output transistors each having a base, a collector and an emitter, the bases of the output transistors being connected to receive the differential signal output from the input means, the collectors being connected to a first reference potential level and the emitters being connected to the first and second conductors respectively, a differential transmission line coupled between the input means and the bases of the first and second output transistors for transmitting the differential signal output from the input means to the output transistors, and output enable means coupled to the bases of the output transistors for selectively placing the input means either in a conductive condition, in which the differential signal output from the input means is applied to the transmission line as the differential output, or in a non-conductive condition, in which the transmission line is isolated from the input of the bus driver.

5. A switcher according to claim 4, further comprising a power source connected to the first and second conductors for supplying power via the output transistors and the differential transmission line to the input means of the bus driver whose output enable means have placed the input means in the conductive condition.

6. A switcher composed of at least first and second crosspoint modules, each having a plurality of inputs and one output, a first differential transmission line having first and second conductors, and at least first and second bus drivers, each having a differential input connected to the output of the respective crosspoint module and having a differential output connected to the first differential transmission line, and wherein each bus driver comprises input means for receiving a differential signal applied to the differential input of the bus driver and for providing a differential signal, output means having first and second output transistors each having a base, a collector and an emitter with the collectors being connected to a first reference potential level and the emitters being connected as the differential output to the first differential transmission line, a second differential transmission line applying the differential signal to the bases of the output transistors of the output means, and output enable means coupled to the bases of the output transistors of the output means for selectively placing the input means either in a first conductive condition, in which the differential signal is applied to the first differential transmission line as the differential output, or in a non-conductive condition, in which the first differential transmission line is isolated from the input of the bus driver.

7. A switcher according to claim 6, wherein the output enable means of each bus driver comprise:
    an output enable transistor having a base, a collector and an emitter, the emitter being connected to the first reference potential level (ground) and the collector being connected to a second reference potential level through at least one resistor, and
    first and second resistors connecting the bases of the first and second output transistors respectively to a node between the collector of the output enable transistor and said one resistor.

8. A switcher according to claim 7, wherein the second differential transmission line is terminated by the first and second output transistors.

9. A switcher according to claim 6, wherein the crosspoint modules are spaced at a substantial distance from the first transmission line, the input means of each bus driver is close to the crosspoint module to which it is connected, and the output means is close to the first transmission line.

10. A switcher according to claim 6, further comprising a power source connected to the first and second conductors for supplying power via the output means and second differential transmission line to the input means of the bus driver whose output enable means has placed the input means in the conductive condition.

* * * * *